(12) United States Patent
Niu

(10) Patent No.: US 9,099,404 B2
(45) Date of Patent: Aug. 4, 2015

(54) ARRAY SUBSTRATE AND MANUFACTURING METHOD THEREOF, OLED DISPLAY DEVICE

(71) Applicant: BOE Technology Group Co., Ltd., Beijing (CN)

(72) Inventor: Jing Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/041,186

(22) Filed: Sep. 30, 2013

(65) Prior Publication Data

US 2014/0091291 A1    Apr. 3, 2014

(30) Foreign Application Priority Data

Sep. 28, 2012 (CN) .......................... 2012 1 0372198

(51) Int. Cl.
*H01L 27/32* (2006.01)
*H01L 33/08* (2010.01)
*H01L 27/12* (2006.01)

(52) U.S. Cl.
CPC .............. *H01L 27/32* (2013.01); *H01L 27/124* (2013.01); *H01L 27/1251* (2013.01); *H01L 27/3276* (2013.01); *H01L 33/08* (2013.01); *H01L 27/1225* (2013.01); *H01L 27/3262* (2013.01); *H01L 2227/323* (2013.01)

(58) Field of Classification Search
CPC ... H01L 27/32; H01L 27/3276; H01L 27/124; H01L 27/1251; H01L 33/08

USPC ........................................ 257/40, 88; 438/99
See application file for complete search history.

(56) References Cited

U.S. PATENT DOCUMENTS 4,988,638 A    1/1991   Huang et al.
7,825,406 B2 * 11/2010  Yoshida et al. ................. 257/40
(Continued)

FOREIGN PATENT DOCUMENTS

CN         1607872 A    4/2005
CN       101211862 A    7/2008
(Continued)

OTHER PUBLICATIONS

Le Contellec et al., Two-Mask a-Si-H. TFT Matrix for Active Liquid Crystal Displays, Optoelectronics-Devices and Technologies, vol. 7, No. 2, pp. 287-299, Dec. 1992.
(Continued)

*Primary Examiner* — Allan R Wilson

(57) ABSTRACT

An array substrate and a manufacturing method thereof, and an OLED display device are provided. The array substrate comprises: sub-pixel units defined by gate lines and data lines that cross with each other on a substrate, each of the sub-pixel units comprising a first TFT, a second TFT and a pixel electrode, a gate electrode of the first TFT being connected to the gate line, a source electrode of the first TFT being connected to the data line, and a drain electrode of the second TFT being connected to the pixel electrode. The source electrode and a drain electrode of the first TFT are formed on the same layer as a gate electrode of the second TFT, and the drain electrode of the first TFT is directly connected to the gate electrode of the second TFT.

10 Claims, 6 Drawing Sheets

(56) References Cited

U.S. PATENT DOCUMENTS

| | | | |
|---|---|---|---|
| 8,274,207 B2* | 9/2012 | Kanegae | 313/498 |
| 2002/0093290 A1 | 7/2002 | Yamazaki | |
| 2006/0066644 A1* | 3/2006 | Yamaguchi et al. | 345/690 |
| 2007/0002195 A1* | 1/2007 | Cho | 349/43 |
| 2008/0078992 A1* | 4/2008 | Yang et al. | 257/40 |
| 2008/0151159 A1 | 6/2008 | Kim et al. | |
| 2009/0243470 A1 | 10/2009 | Chu et al. | |
| 2009/0321725 A1 | 12/2009 | Yoshida et al. | |
| 2012/0033161 A1* | 2/2012 | Han et al. | 349/106 |
| 2012/0305910 A1 | 12/2012 | Hsieh et al. | |
| 2013/0105803 A1* | 5/2013 | Song et al. | 257/59 |

FOREIGN PATENT DOCUMENTS

| | | |
|---|---|---|
| CN | 102280491 A | 12/2011 |
| CN | 102629621 A | 8/2012 |
| CN | 202796957 U | 3/2013 |
| DE | 4337871 A1 | 5/1994 |
| DE | 102004059396 B3 | 9/2006 |
| EP | 1950804 A2 | 7/2008 |

OTHER PUBLICATIONS

Extended Search Report for European Patent Application No. 13186639.4 dated Jan. 16, 2014.
English abstract of CN101211862A, listed above, 1 page.
Third Office Action (Chinese language) issued by the State Intellectual Property Office ("SIPO") for International Application No. 20121037219807, 12 pages.
English translation of the third Office Action issued by SIPO (listed above) for International Application No. 20121037219807, 16 pages.
First Office Action issued by the Chinese Patent Office for Chinese Patent Application No. 201210372198.7 dated Jul. 14, 2014, 9pgs.
English translation of First Office Action issued by the Chinese Patent Office for Chinese Patent Application No. 201210372198.7 dated Jul. 14, 2014, 11pgs.
Second Office Action issued by the Chinese Patent Office for Chinese Patent Application No. 201210372198.7 dated Sep. 16, 2014, 11pgs.
English translation of Second Office Action issued by the Chinese Patent Office for Chinese Patent Application No. 201210372198.7 dated Sep. 16, 2014, 14pgs.

* cited by examiner

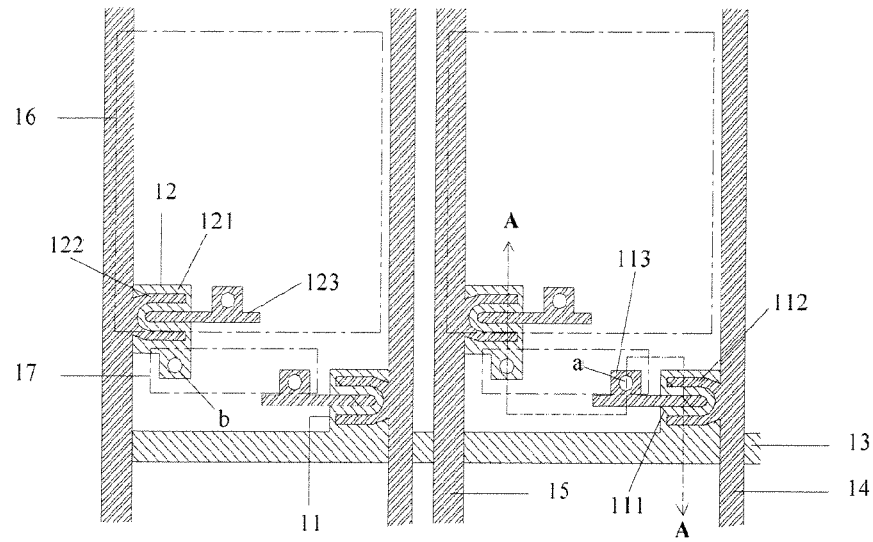
FIG. 1 - PRIOR ART
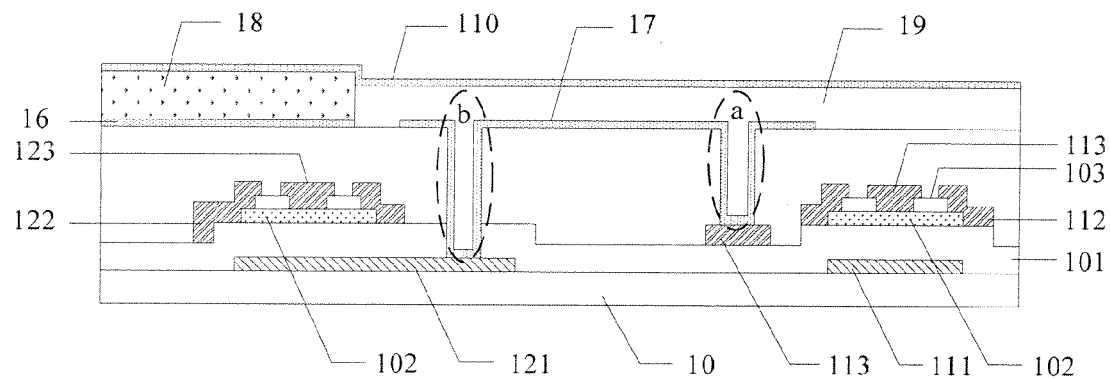
FIG. 2 - PRIOR ART

ARRAY SUBSTRATE AND MANUFACTURING METHOD THEREOF, OLED DISPLAY DEVICE

CROSS REFERENCE TO RELATED APPLICATIONS

This application claims priority from Chinese National Application No. 201210372198.7 filed on Sep. 28, 2012, the contents of which are incorporated herein by reference.

BACKGROUND

Embodiments of the present invention relate to an array substrate and a method for manufacturing the same, and an OLED display device.

Among various display devices available now, an OLED (Organic Light-Emitting Diode) display has a lighter and thinner profile design, a wider visible angle, a faster response speed, a lower power consumption and other features as compared to a CRT (Cathode Ray Tube) display or a TFT-LCD (Thin Film Transistor-Liquid Crystal Display), and so the OLED display has gotten people's attention as the next generation of display devices gradually.

The OLED display device is a self-luminous device, which usually includes a pixel electrode, a counter electrode disposed in opposition to the pixel electrode and an organic light emitting layer disposed between the pixel electrode and the counter electrode. In the OLED display device, by means of applying a voltage to the pixel electrode and the counter electrode, an electric field is formed across the organic light emitting layer disposed between the pixel electrode and the counter electrode, so that electrons and holes can recombine with each other in the organic light emitting layer to give off light. The voltage applied to the pixel electrode can be controlled by an array substrate with circuit units, so as to control the display effect of the OLED display device.

In the related art, in order to control the display effect of the OLED display device better, the circuit units of the array substrate generally adopt a structure of two TFTs (Thin Film Transistors), in which, a first TFT is a switch transistor, and a second TFT is a drive transistor. The partial structure of pixel units is illustrated in FIG. 1, and FIG. 2 is a cross-sectional view in the direction of A-A of FIG. 1. In FIG. 1, a gate line 13 is connected to a gate electrode (i.e. a first gate electrode 111) of a TFT 11, a data line 14 is connected to a source electrode (i.e. a first source electrode 112) of the TFT 11, and a first drain electrode 113 of the TFT 11 is connected to a gate electrode (i.e. a second gate electrode 121) of a TFT 12 through a via hole a. A Vdd line 15 parallel to the data line 14 is connected to a source electrode (i.e. a second source electrode 122) of the TFT 12, a second drain electrode 123 of the TFT 12 is connected to a pixel electrode 16. As can be seen from the sectional drawing FIG. 2, two TFTs are formed on a substrate 10, and each adopt a bottom-gate structure, and a gate insulating layer 101, an active layer 102 formed of an oxide and an etching blocking layer 103 are further formed on the first gate electrode 111 and the second gate electrode 121 in sequence. The first drain electrode 113 is connected to a connecting electrode 17 through the via hole a, and the second gate electrode 121 is connected to the connecting electrode 17 through a via hole b, so the first drain electrode 113 and the second gate electrode 121 can be connected by the connecting electrode 17 in the same layer as the pixel electrode 16. To avoid short circuit between the connecting electrode 17 and other electrode, the coverage zone of the pixel electrode 16 should keep away from the region where the connecting electrode 17 is located. As shown in FIG. 1, an organic light emitting layer 18 disposed on a corresponding pixel electrode 16 should also keep away from the region where the connecting electrode 17 is located, which needs to be covered by a light shielding material 19, and a counter electrode 110 is provided on surfaces of the organic light emitting layer 18 and the light shielding material 19, so as to constitute an OLED display device.

Due to existence of the connecting electrode 17, the region where the connecting electrode 17 is located needs to be covered by a black matrix, so that the area of an effective emitting zone of the OLED display device is decreased, and the display brightness is reduced. On the other hand, the array substrate of the OLED display device with such a structure needs to experience seven mask procedures from provision of a gate electrode to provision of a pixel electrode, so as to form a gate layer, a gate insulating layer, an active layer, an etching blocking layer, a source and drain electrode layer, a resin layer and a pixel electrode and a connecting electrode. Also, to connect the first drain electrode 113 and the second gate electrode 121, it is necessary that a plurality of via holes be provided on the substrate, which will cause the fabrication process of the OLED display device to be more complex. Thus, the production difficulty and the production cost of products are largely raised.

SUMMARY

Embodiments of the invention provide an array substrate and a method for manufacturing the same, and an OLED display device, capable of increasing an effective emitting area, simplifying the fabrication process, and reducing the production difficulty and production cost of products.

To achieve the above objects, the following technical solutions are employed in embodiments of the invention:

In an aspect of embodiments of the invention, there is provided an array substrate, comprising: a plurality of sub-pixel units defined by gate lines and data lines that cross with each other on a substrate, each of the sub-pixel units comprising a first thin film transistor (TFT), a second TFT and a pixel electrode, a gate electrode of the first TFT being connected to the gate line, a source electrode of the first TFT being connected to the data line, and a drain electrode of the second TFT being connected to the pixel electrode, wherein, the source electrode and a drain electrode of the first TFT are formed on a same layer as a gate electrode of the second TFT, and the drain electrode of the first TFT is directly connected to the gate electrode of the second TFT.

In another aspect of embodiments of the invention, there is provided an OLED display device, comprising: an array substrate, a pixel electrode, a counter electrode formed on the array substrate and an organic light emitting layer located between the pixel electrode and the counter electrode of the array substrate, the array substrate being the above-mentioned array substrate.

In another aspect of embodiments of the invention, there is provided a method for manufacturing an array substrate, comprising:

forming patterns of a gate electrode of a TFT with a bottom-gate structure, a source electrode and a drain electrode of a TFT with a top-gate structure and a gate insulating layer on a substrate, respectively;

forming patterns of an active layer and an etching blocking layer on a surface of the substrate through a patterning process in sequence;

forming patterns of a source electrode and a drain electrode of the TFT with the bottom-gate structure and a gate electrode of the TFT with the top-gate structure;

forming a resin layer that has a via hole;

forming a pixel electrode, which is connected to the drain electrode of one of the TFT with the bottom-gate structure and the TFT with the top-gate structure through the via hole.

With respect to the array substrate and the manufacturing method thereof and the OLED display device provided by embodiments of the invention, the array substrate includes a plurality of sub-pixel units defined by the gate lines and the data lines that cross with each other on the substrate, and further, each of the sub-pixel units includes the first TFT, the second TFT and the pixel electrode, the source electrode and the drain electrode of the first TFT and the gate electrode of the second TFT being formed on the same layer. The two TFTs adopt such a structure of one top gate plus one bottom gate, so as to allow the drain electrode of the first TFT and the gate electrode of the second TFT to be directly connected. Accordingly, it may be unnecessary to provide a connecting electrode for connecting the drain electrode of the first TFT and the gate electrode of the second TFT. In such a way, coverage area of a black matrix can be decreased, thereby increasing the area of an effective emitting zone significantly, increasing the opening ratio, and enhancing the display brightness of the display device. Also, with the double-TFT structure having one top gate and one bottom gate, the mask procedures necessary for the substrate from formation of a first layer of metal to the ultimate formation of a pixel electrode can also be decreased and a large number of via holes do not need to be formed, which will simplify the fabrication process largely. Thus, production difficulty and production cost of products are effectively reduced.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

FIG. 1 is a structurally top view illustrating a part of an array substrate in related art;

FIG. 2 is a cross-sectional view in the direction of A-A of FIG. 1;

FIG. 3b is a cross-sectional view in the direction of B-B of FIG. 3a;

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Figure 3A:
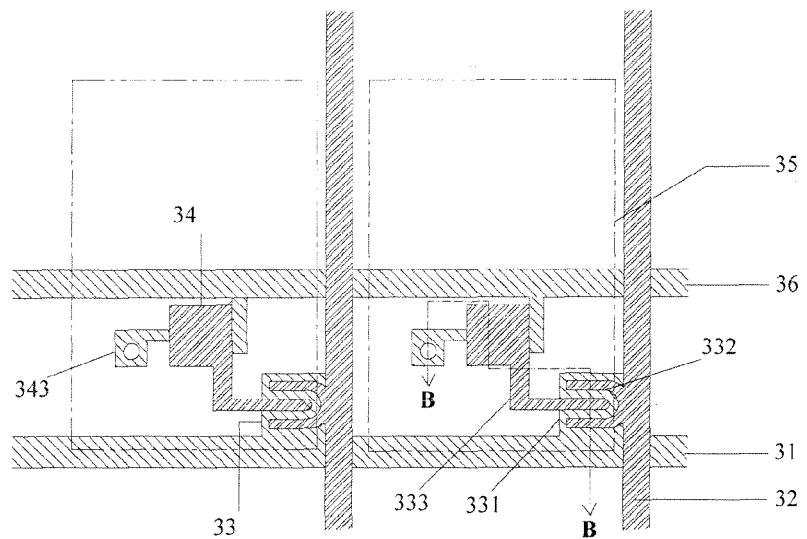
FIG. 3a is a structurally top view illustrating a part of an array substrate provided by an embodiment of the invention.

An array substrate 30 provided by an embodiment of the invention, as illustrated in FIG. 3a, comprises: a plurality of sub-pixel units defined by gate lines 31 and data lines 32 that cross with each other on a substrate 300, and each of the sub-pixel units comprises a first TFT 33, a second TFT 34 and a pixel electrode 35. A gate electrode 331 of the first TFT 33 is connected to a gate line 31, a source electrode 332 of the first TFT 33 is connected to a data line 32, and a drain electrode 343 of the second TFT 34 is connected to the pixel electrode 35.

Figure 3B:
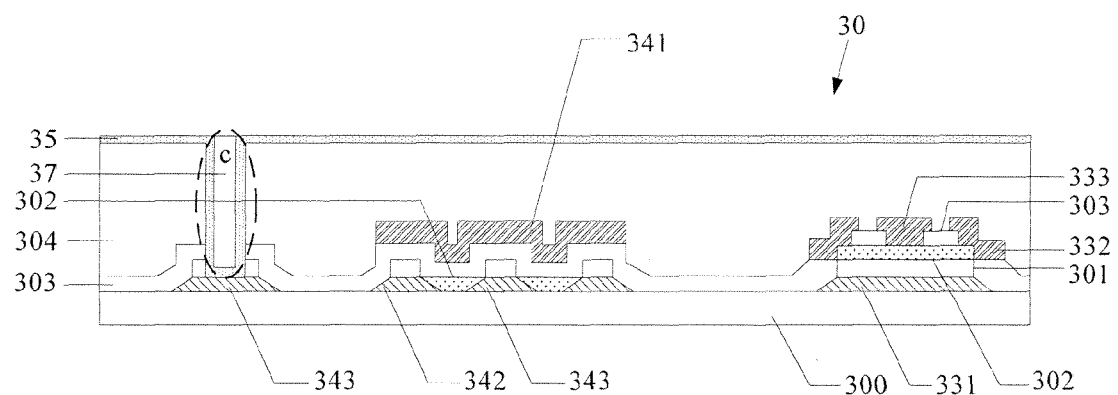

As shown in FIG. 3b, the source electrode 332 and a drain electrode 333 of the first TFT 33 and a gate electrode 341 of the second TFT 34 are formed on the same layer, and the drain electrode 333 of the first TFT 33 and the gate electrode 341 of the second TFT 34 are directly connected to each other. For example, the drain electrode 333 and the gate electrode 341 are integrally formed (as shown in FIG. 3a).

Furthermore, the source electrode 332 and the drain electrode 333 of the first TFT 33 and the data line 32 (not shown in FIG. 3b) are formed on the same layer, and the gate electrode 331 of the first TFT 33 and a source electrode 342 and the drain electrode 343 of the second TFT 34 are formed on the same layer.

The array substrate provided by the embodiment of the invention includes a plurality of sub-pixel units defined by the gate lines and the data lines that cross with each other on the substrate, and further, each of the sub-pixel units includes the first TFT, the second TFT and the pixel electrode, the source electrode and the drain electrode of the first TFT and the gate electrode of the second TFT being formed on the same layer. The two TFTs adopt such a structure of one top gate plus one bottom gate, so as to allow the drain electrode of the first TFT and the gate electrode of the second TFT to be directly connected. Thus, it may be unnecessary to provide a connecting electrode for connecting the drain electrode of the first TFT and the gate electrode of the second TFT. In such a way, coverage area of a black matrix can be decreased, thereby increasing the area of an effective emitting zone significantly, increasing the opening ratio, and enhancing the display brightness of the display device. Also, with the double-TFT structure having one top gate and one bottom gate, the mask procedures necessary for the substrate from formation of a first layer of metal to the ultimate formation of a pixel electrode is also decreased from seven in related art to six and a large number of via holes do not need to be formed, which will simplify the fabrication process largely. Thus, production difficulty and production cost of products are effectively reduced.

It is to be noted that, the array substrate 30 further comprises a Vdd line 36 for input of a positive power. In practical applications, source electrodes of second TFTs in sub-pixel units in the same row can each be connected to the Vdd line.

Further, in the array substrate 3 shown in FIG. 3a, the pixel electrode 35 may fully cover the region of a sub-pixel unit.

In the embodiment of the invention, the two TFTs adopt a top-gate structure and a bottom-gate structure, respectively, and the drain electrode of the first TFT and the gate electrode of the second TFT are connected directly. Therefore, in a practical application, the array substrate may concretely be an array substrate in which a first TFT still adopt the bottom-gate structure and a second TFT adopts the top-gate structure, or, an array substrate in which a first TFT adopts the top-gate structure and a second TFT still adopts the bottom-gate structure.

For example, as shown in FIG. 3b, the TFT with top-gate structure comprises: a source electrode and a drain electrode that are formed on a surface of the substrate and separated from each other, an active layer formed between the source electrode and the drain electrode, a first insulating layer (gate insulating layer) located directly above the source electrode and the drain electrode, a second insulating layer (etching blocking layer) that covers the first insulating layer and the active layer; and a gate electrode located over the second insulating layer; the TFT with bottom-gate structure comprises: a gate electrode formed on the surface of the substrate, a first insulating layer (gate insulating layer) formed over the gate electrode, an active layer formed over the first insulating layer, a second insulating layer (etching blocking layer), which is formed over the active layer and by which, a part of the active layer is exposed, and a source electrode and a drain electrode that are formed over the second insulating layer and contact with the exposed active layer.

In the array substrate 30 shown in FIG. 3b, description has been given with reference to an example in which the first TFT still adopts the bottom-gate structure and the second TFT adopts the top-gate structure.

As shown in FIG. 3b, both the gate electrode 331 of the first TFT 33 and the source electrode 342 and the drain electrode 343 of the second TFT 34 are formed on the surface of the substrate 300.

Specifically, the substrate 300 concretely may be a transparent substrate including a glass substrate or a transparent resin substrate. It is possible that a metal layer and a gate insulating layer are deposited on the surface of the substrate 300, and subjected to one patterning process so as to form patterns of the gate electrode 331 of the first TFT 33, the source electrode 342 and the drain electrode 343 of the second TFT 34 and the gate insulating layer 301 finally.

The pixel electrode 35 may be connected to the drain electrode 343 of the second TFT 34 through a via hole c.

Further, the active layer 302, the etching blocking layer 303, the source electrode 332 and the drain electrode 333 of the first TFT 33 and the gate electrode 341 of the second TFT 34, the resin layer 304 and the pixel electrode 35 may be formed on surfaces of the gate electrode 331 of the first TFT 33 and the source electrode 342 and the drain electrode 343 of the second TFT 34 in sequence.

Specifically, six patterning processes are needed to form gate electrode 331 of the first TFT 33, the source electrode 342 and the drain electrode 343 of the second TFT 34, the active layer 302, the etching blocking layer 303, the source electrode 332 and the drain electrode 333 of the first TFT 33 and the gate electrode 341 of the second TFT 34, the resin layer 304 and the pixel electrode 35 layer by layer. Each level of the above hierarchical structure should have an opening zone over the drain electrode 343 of the second TFT 34, so as to form the via hole c, bottom of which being the drain electrode 343 of the second TFT 34.

Further, edges of both the source electrode 342 and the drain electrode 343 of the second TFT 34 may be inclined planes, and the active layer 302 may be formed between the source electrode 342 and the drain electrode 343 of the second TFT 34 and contact with the source electrode 342 and the drain electrode 343 of the second TFT 34 through the inclined planes. As shown in FIG. 3b, the active layer 302 may be formed between the source electrode 342 and the drain electrode 343 of the second TFT 34. That is, as shown in FIG. 3b, in the TFT with top-gate structure, the upper widths of the source electrode and the drain electrode are smaller than the lower widths of them so that side faces of the source electrode and the drain electrode are inclined planes, and the active layer contacts with the source electrode and the drain electrode through the inclined planes.

As such, it can be ensured that each of the source electrode 342 and the drain electrode 343 of the second TFT 34 has a larger contacting face with the active layer 302, so as to guarantee stability of electrical connection between source and drain electrodes and the active layer and improve quality of display device products further.

Further, a light shielding material 37 may be filled in the via hole c, and a surface of the light shielding material 37 may be flush with a surface of the pixel electrode 35.

During manufacture of the array substrate, to avoid unnecessary dark-state light leakage, it is usually necessary that a layer of a black matrix be formed at edges of sub-pixel units, i.e. the place where the gate lines and the data lines are located. The light shielding material 37 filled in the via hole c may be formed in the same patterning process as the black matrix at edges of the sub-pixel units. In this way, it can be ensured that the thickness of an organic light emitting layer on the pixel electrode is uniform, so as to make sure that the amount of light emitted by the organic light emitting layer in individual regions of a sub-pixel unit is uniform and to improve display quality of the display device.

With such an array substrate provided by the embodiment of the invention, adoption of such a structure of one top gate plus one bottom gate by the two TFTs can make the drain electrode of the first TFT and the gate electrode of the second TFT be connected directly, and thus, it may be possible that the whole sub-pixel region is covered by the pixel electrode without the necessity of providing a connecting electrode for connecting the drain electrode of the first TFT and the gate electrode of the second TFT. As such, the coverage area of the black matrix is decreased, the area of an effective emitting zone is increased significantly, and the display brightness of the display device is enhanced. Also, with the double-TFT structure having one top gate and one bottom gate, the mask procedures necessary for the substrate from formation of a first layer of metal to the ultimate formation of a pixel electrode is also decreased from seven in the related art to six and a large number of via holes do not need to be formed, which will simplify the fabrication process largely. Thus, production difficulty and production cost of products are effectively reduced.

Figure 4:
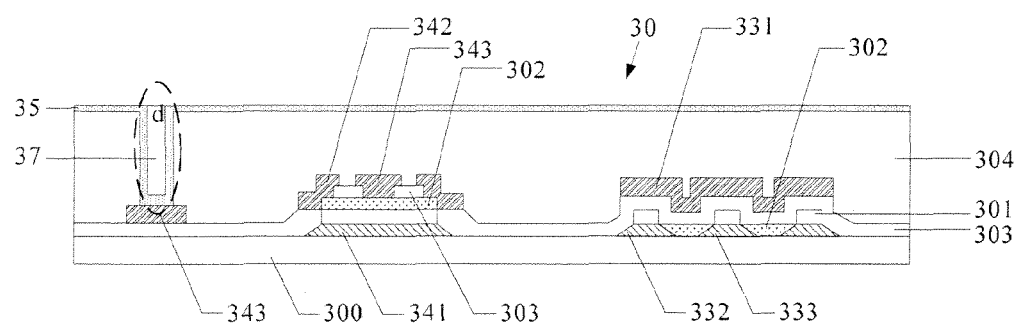
FIG. 4 is a structurally schematic view illustrating another array substrate provided by an embodiment of the invention.

Or, the array substrate 30 provided by the embodiment of the invention may also be the same as an array substrate shown in FIG. 4, in which, a first TFT adopts the top-gate structure, while a second TFT still adopts the bottom-gate structure.

As shown in FIG. 4, a source electrode 332 and a drain electrode 333 of a first TFT 33 and a gate electrode 341 of a second TFT 34 are each formed on a surface of a substrate 300.

A pixel electrode 35 may be connected to a drain electrode 343 of the second TFT 34 through a via hole d likewise. As the drain electrode 343 of the second TFT 34 is located at top of the second TFT 34, as compared with the via hole c in the foregoing embodiment, the via hole d in such a structure only has to penetrate through a resin layer but does not need to penetrate through a gate insulating layer and an etching blocking layer. In such a way, manufacture of the via hole becomes relatively simple, thereby reducing production difficulty of the display device further.

Similar to the foregoing embodiment, it is possible that a metal layer and a gate insulating layer are deposited on the surface of the substrate 300, and subjected to one patterning process so as to form patterns of the source electrode 332 and the drain electrode 333 of the first TFT 33, the gate electrode 341 of the second TFT 34 and a gate insulating layer 301 finally.

Further, the gate insulating layer 301, an active layer 302, an etching blocking layer 303, a gate electrode 331 of the first TFT 33 and a source electrode 342 and a drain electrode 343 of the second TFT 34, a resin layer 304 and the pixel electrode 35 may be formed on surfaces of the source electrode 332 and drain electrode 333 of the first TFT 33 and the gate electrode 341 of the second TFT 34 in sequence.

In the array substrate provided by the embodiment of the invention, six patterning processes are required as well to form the source electrode 332 and the drain electrode 333 of the first TFT 33, the gate electrode 341 of the second TFT 34 and the gate insulating layer 301, the active layer 302, the etching blocking layer 303, the gate electrode 331 of the first TFT 33 and the source electrode 342 and the drain electrode 343 of the second TFT 34, the resin layer 304 and the pixel electrode 35 layer by layer. As such, from formation of a first layer of metal to the ultimate formation of the pixel electrode, it is required that a total of six mask procedures be conducted on the substrate.

With the array substrate having such a structure, as the drain electrode of the first TFT and the gate electrode of the second TFT are formed on the same layer and connected directly, the production process is simplified further.

Further, an edge of each of the source electrode 332 and the drain electrode 333 of the first TFT 33 is an inclined plane, and the active layer 302 may be formed between the source electrode 332 and the drain electrode 333 of the first TFT 33 and contact with the source electrode 332 of the first TFT 33 through the inclined plane. As shown in FIG. 4, the active layer 302 may be formed between the source electrode 332 and the drain electrode 333 of the first TFT 33.

By doing this, it can be ensured that each of the source electrode 342 and the drain electrode 343 of the second TFT 34 has a larger contacting face with the active layer 302, so as to guarantee stability of the electrical connection between source and drain electrodes and the active layer and improve quality of display device products further.

Further, similar to the foregoing embodiment, a light shielding material 37 may be filled in the via hole d as well, and a surface of the light shielding material 37 may be flush with a surface of the pixel electrode 35.

In addition, as regards the embodiment shown in FIG. 4, the main difference between it and the embodiment shown in FIGS. 3a and 3b lies in interchange of type between the first and second TFTs. Thus, regarding other description of structure, reference may also be made to the embodiment shown in FIGS. 3a and 3b, details being omitted here.

With such an array substrate provided by the embodiment of the invention, the two TFTs adopt such a structure of one top gate plus one bottom gate, so that the drain electrode of the first TFT and the gate electrode of the second TFT can be connected directly. Accordingly, it may be possible that the whole sub-pixel region is covered by the pixel electrode without the necessity of providing a connecting electrode for connecting the drain electrode of the first TFT and the gate electrode of the second TFT. As such, the coverage area of a black matrix can be decreased, so as to increase the area of an effective emitting zone significantly, increase the opening ratio, and enhance the display brightness of the display device. On the other hand, adoption of such a structure also make the mask procedures necessary for the substrate from formation of a first layer of metal to the ultimate formation of a pixel electrode be decreased from seven in the related art to six without the necessity of forming a large number of via holes, which will simplify the fabrication process largely. Thus, production difficulty and production cost of products are effectively reduced.

Figure 5:
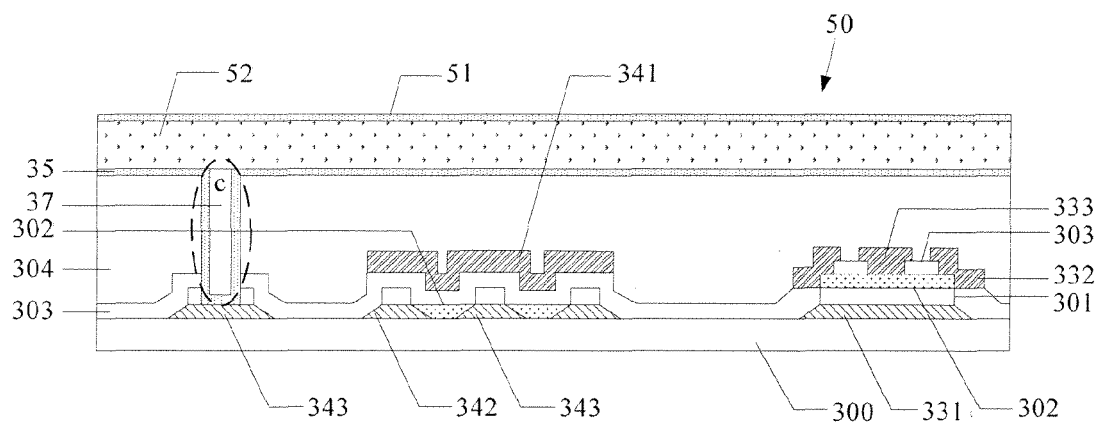
FIG. 5 is a structurally schematic view illustrating an OLED display device provided by an embodiment of the invention.

The array substrate provided by the embodiment of the invention can be applied extensively to various OLED display devices available now. For example, in an OLED display device 50 shown in FIG. 5, the OLED display device 50 may specifically include: an array substrate 30, a pixel electrode 35, a counter electrode 51 and an organic light emitting layer 52 located between the pixel electrode 35 and the counter electrode 51 of the array substrate 30, where, the array substrate 30 may be the above-mentioned array substrate 30.

It is to be noted that, in the embodiment of the invention, the array substrate 30 in the OLED display device 50 will be described with the array substrate 30 shown in FIG. 3b as an example, but is not limitative of the invention.

As the structure of the array substrate 30 has been described in detail in the foregoing embodiment, details are omitted here.

The OLED display device provided by the embodiment of the invention includes the array substrate, which comprises a plurality of sub-pixel units defined by gate lines and data lines that cross with each other on the substrate. Further, each of the sub-pixel units includes the first TFT, the second TFT and the pixel electrode, and the source electrode and the drain electrode of the first TFT and the gate electrode of the second TFT are formed on the same layer. The two TFTs adopt such a structure of one top gate plus one bottom gate, so as to allow the drain electrode of the first TFT and the gate electrode of the second TFT to be directly connected. Thus, it may be unnecessary to provide a connecting electrode for connecting the drain electrode of the first TFT and the gate electrode of the second TFT. In such a way, coverage area of a black matrix can be decreased, thereby increasing the area of an effective emitting region significantly, and enhancing the display brightness of the display device. On the other hand, because such a way of combining bottom gate and top gate is used, the mask procedures necessary for the substrate from formation of a first layer of metal to ultimate formation of a pixel electrode is also decreased from seven in the related art to six and a large number of via holes do not need to be formed, which will simplify the fabrication process largely. Thus, production difficulty and production cost of products are effectively reduced.

A manufacturing method of an array substrate provided by an embodiment of the invention comprises:

S601, patterns of a gate electrode of a first TFT, a source electrode and a drain electrode of a second TFT and a gate insulating layer are formed on a substrate, respectively.

Specifically, as the gate electrode of the first TFT needs to be connected to a gate line, and moreover the source electrode of the second TFT needs to be connected to a Vdd line for input of a positive power, it is possible that through one patterning process, patterns of the gate line, the Vdd line, the gate electrode of the first TFT, the source electrode and the drain electrode of the second TFT and the gate insulating layer are formed on the substrate, respectively.

S602, patterns of a gate insulating layer, an active layer and an etching blocking layer are formed in sequence on surfaces of the gate electrode of the first TFT and the source electrode and the drain electrode of the second TFT through patterning process.

Edges of both the source electrode and the drain electrode of the second TFT may be inclined planes, and an active layer 302 may be formed between the source electrode 342 and the drain electrode 343 of the second TFT 34 and contact with the source electrode 342 and the drain electrode 343 of the second TFT 34 through the inclined planes.

S603, patterns of a source electrode and a drain electrode of the first TFT and a gate electrode of the second TFT are formed.

Specifically, as the source electrode of the first TFT needs to be connected to a data line, it is possible that through one patterning process, patterns of the data line, the source electrode and the drain electrode of the first TFT and the gate electrode of the second TFT are formed, respectively.

S604, a resin layer having a via hole is formed, the bottom of the via hole being the drain electrode of the second TFT.

S605, a pixel electrode that is connected to the drain electrode of the second TFT through the via hole is formed.

With respect to the manufacturing method of the array substrate provided by the embodiment of the invention, the array substrate includes a plurality of sub-pixel units defined by gate lines and data lines that cross with each other on the substrate. Further, each of the sub-pixel units includes the first TFT, the second TFT and the pixel electrode, and the source electrode and the drain electrode of the first TFT and the gate electrode of the second TFT are formed on the same layer. The two TFTs adopt such a structure of one top gate plus one bottom gate, so as to allow the drain electrode of the first TFT and the gate electrode of the second TFT to be directly connected. Accordingly, it may be unnecessary to provide a connecting electrode for connecting the drain electrode of the first TFT and the gate electrode of the second TFT. In such a way, coverage area of a black matrix can be decreased, thereby increasing the area of an effective emitting zone significantly, and enhancing the display brightness of the display device. On the other hand, because such a way of combining bottom gate and top gate is used, the mask procedures necessary for the substrate from formation of a first layer of metal to ultimate formation of a pixel electrode is also decreased from seven in the related art to six and a large number of via holes do not need to be formed, which will simplify the fabrication process largely. Thus, production difficulty and production cost of products are effectively reduced.

Further, as shown in FIG. 6, the manufacturing method of the array substrate may further include:

S606, a light shielding material is filled in a via hole of the array substrate with the pixel electrode formed, so that a surface of the light shielding material is flush with a surface of the pixel electrode.

During manufacture of the array substrate, to avoid unnecessary dark-state light leakage, it is usually necessary that a layer of black matrix be formed at edges of sub-pixel units, i.e. the place where the gate lines and the data lines are located. The light shielding material filled in the via hole c may be formed in the same patterning process as the black matrix at edges of the sub-pixel units. By doing this, it can be ensured that the thickness of an organic light emitting layer on the pixel electrode is uniform, so as to make sure that the amount of light emitted by an organic light emitting layer in various regions of a sub-pixel unit is uniform and to improve display quality of the display device.

Hereinafter, the manufacturing method of the array substrate provided by the embodiment of the invention will be described by giving an example.

Figure 6A:
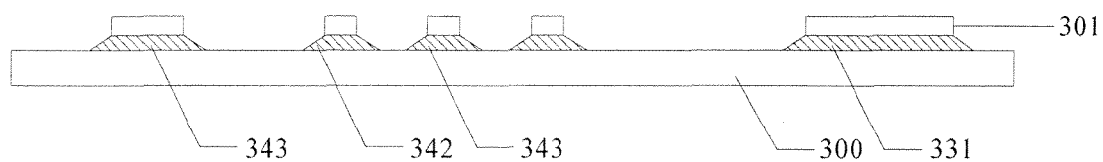
FIG. 6a is a structurally schematic view illustrating a substrate on which patterns of a first metal layer and a gate insulating layer are formed.

Firstly, a first metal layer and a gate insulating layer 301 are needed to be deposited on a substrate 300, and are subjected to exposure, development and etching so as to obtain the patterns shown in FIG. 6a, in which, patterns of a gate line 31, a Vdd line 36 (the gate line 31 and the Vdd line 36 are not shown in FIG. 6a), a gate electrode 331 of a first TFT 33 and a source electrode 342 and a drain electrode 343 of a second TFT 34 are formed respectively by the first metal layer, and the gate insulating layer 301 only covers the region where metal is present. Further, it is possible that each of the source electrode 342 and the drain electrode 343 of the second TFT 34 is made to have a relatively small sloping angle and an edge being an inclined plane by means of controlling film-forming and etching conditions.

Figure 6B:
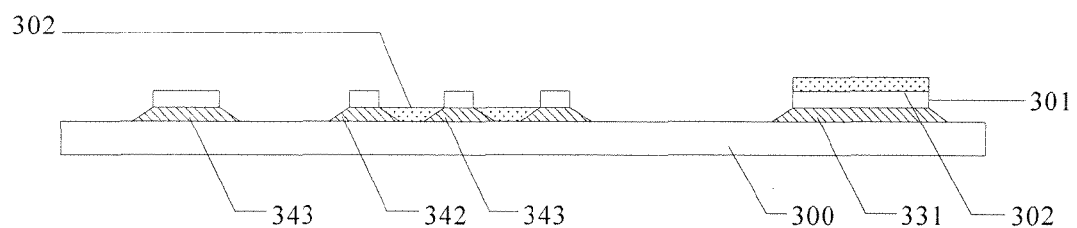
FIG. 6b is a structurally schematic view illustrating the substrate on which pattern of an active layer is formed.

An active layer 302 is directly deposited on the substrate 300 with the above structure formed, and subjected to exposure, development and etching so as to obtain a patterned structure of the active layer, where, an IGZO (indium gallium zinc oxide) material may be selected to fabricate the active layer, and the active layer 302 may be filled between the source electrode 342 and the drain electrode 343 of the second TFT 34, and this structure is illustrated in FIG. 6b.

Figure 6C:
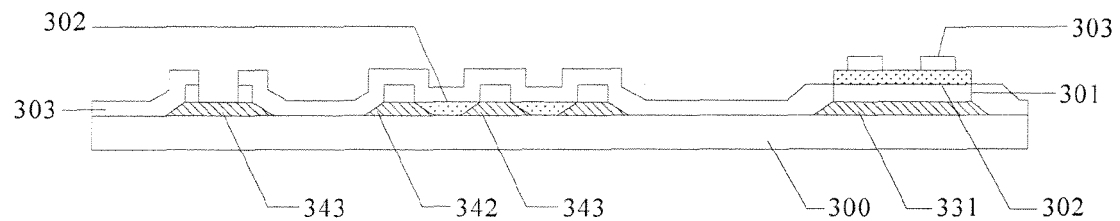
FIG. 6c is a structurally schematic view illustrating the substrate on which pattern of an etching blocking layer is formed.

Next, as shown in FIG. 6c, a silicon oxide material is deposited on the substrate 300 to form an etching blocking layer 303, and the pattern obtained after the etching is completed functions as an etch protective layer in the position where the first TFT 33 is located, as the same case with a structure in the related art. For the etching blocking layer 303 in the position where the drain electrode 343 of the second TFT 34 is located, a pattern of via hole c needs to be set aside, and the underlying gate insulating layer 301 is etched completely together; while in the other position, it covers the substrate surface to act as an insulating layer.

Figure 6D:
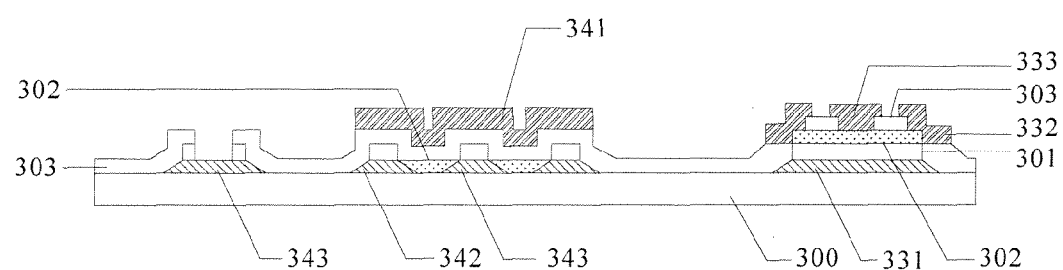
FIG. 6d is a structurally schematic view illustrating the substrate on which pattern of a second metal layer is formed.

A second metal layer is deposited on the substrate 300, and subjected to exposure, development and etching so as to obtain the structure shown in FIG. 6d. In this process, patterns of the data line 32, the source electrode 332 and the drain electrode 333 of the first TFT 33 and the gate electrode 341 of the second TFT 34 are formed simultaneously, and the source electrode 332 of the first TFT 33 and the gate electrode 341 of the second TFT 34 are connected directly.

Figure 6E:
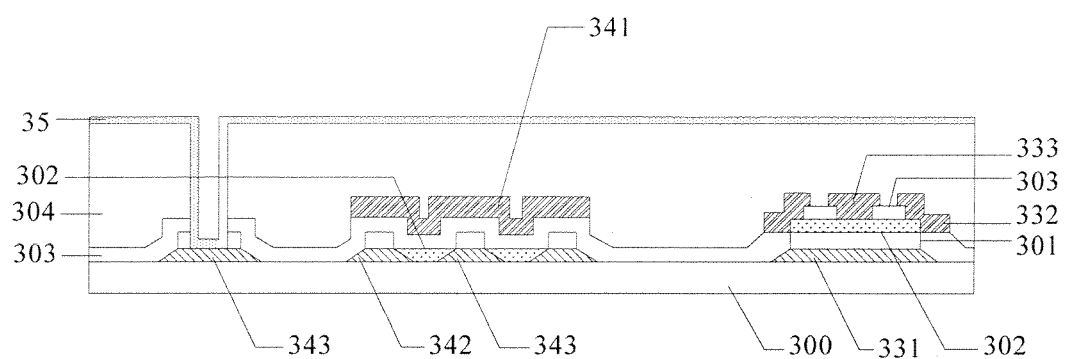
FIG. 6e is a structurally schematic view illustrating the substrate on which a resin layer and a pixel electrode are formed.

A resin layer is coated on the substrate 300 and subjected to exposure and development, so as to attain a resin layer 304 that is opened in the position where the drain electrode 343 of the second TFT 34 is located. Then, a pixel electrode layer is deposited and subjected to patterning process so as to form a pixel electrode 35, which covers individual sub-pixel regions, respectively. The resultant structure is shown in FIG. 6e.

A black resin is coated on the substrate 300 and subjected to patterning process so as to attain a black matrix pattern, the projection of which on the substrate 300 coincides with the projection of data lines and gate lines on the substrate 300, and the width of which is slightly larger than that of the data lines and the gate lines. Also, a light shielding material 37 is filled in the via hole c as well to be flush with a top surface of the pixel electrode 35, so that the array substrate shown in FIG. 3b is obtained finally. With the structure, uniformity of the thickness of an organic light emitter on top can be ensured, so as to assure uniformity of the luminance of the display device.

In the embodiment of the invention, the two TFTs adopt a top-gate structure and a bottom-gate structure, respectively, where, the drain electrode of the first TFT is connected directly to the gate electrode of the second TFT. Therefore, in a practical application, the array substrate may concretely comprise an array substrate in which a first TFT still adopts the bottom-gate structure and a second TFT adopts the top-gate structure, or an array substrate in which a first TFT adopts the top-gate structure and a second TFT still adopts the bottom-gate structure. In the above embodiment, the array substrate in which the first TFT still adopts the bottom-gate structure and the second TFT adopts the top-gate structure has been described as an example.

In an array substrate, if a first TFT adopts the top-gate structure, and a second TFT still adopts the bottom-gate structure, then a manufacturing method of the array substrate comprises:

S801, patterns of a source electrode and a drain electrode of the first TFT, a gate electrode of the second TFT, and a gate insulating layer are formed on a substrate, respectively.

Specifically, as the source electrode of the first TFT needs to be connected to a data line, it is possible that through one patterning process, patterns of the data line, the source electrode and the drain electrode of the first TFT, the gate electrode of the second TFT and the gate insulating layer are formed on the substrate, respectively.

S802, patterns of an active layer and an etching blocking layer are formed in sequence on a surface of the substrate through patterning process.

An edge of each of the source electrode and the drain electrode of the first TFT is an inclined plane, and an active layer 302 may be formed between the source electrode 332 and the drain electrode 333 of the first TFT 33 and contact with the source electrode 332 of the first TFT 33 through the inclined plane.

S803, patterns of a gate electrode of the first TFT and a source electrode and a drain electrode of the second TFT are formed.

Specifically, as the gate electrode of the first TFT needs to be connected to a gate line and moreover the source electrode of the second TFT needs to connected to a Vdd line for input of a positive power, it is possible that through one patterning process, patterns of the gate line, the Vdd line, the gate electrode of the first TFT and the source electrode and the drain electrode of the second TFT are formed, respectively.

S804, a resin layer having a via hole is formed, the bottom of the via hole being the drain electrode of the second TFT.

S805, a pixel electrode that is connected to the drain electrode of the second TFT through the via hole is formed.

With respect to the manufacturing method of the array substrate provided by the embodiment of the invention, the array substrate includes a plurality of sub-pixel units defined by gate lines and data lines that cross with each other on the substrate. Further, each of the sub-pixel units includes the first TFT, the second TFT and the pixel electrode, and the source electrode and the drain electrode of the first TFT and the gate electrode of the second TFT are formed on the same layer. The two TFTs adopt such a structure of one top gate plus one bottom gate, so as to allow the drain electrode of the first TFT and the gate electrode of the second TFT to be directly connected. Accordingly, it may be unnecessary to provide a connecting electrode for connecting the drain electrode of the first TFT and the gate electrode of the second TFT. In such a way, coverage area of a black matrix can be decreased, thereby increasing the area of an effective emitting zone significantly, and enhancing the display brightness of the display device. On the other hand, because such a way of combining bottom gate and top gate is used, the mask procedures necessary for the substrate from formation of a first layer of metal to ultimate formation of a pixel electrode is also decreased from seven in the related art to six and a large number of via holes do not need to be formed, which will simplify the fabrication process largely. Thus, production difficulty and production cost of products are effectively reduced.

Further, the manufacturing method of the array substrate may further include:

S806, a light shielding material is filled in a via hole of the array substrate with the pixel electrode formed, so that a surface of the light shielding material is flush with a surface of the pixel electrode.

The array substrate manufactured by using such a method is shown in FIG. 4. As the drain electrode 343 of the second TFT 34 is located at top of the second TFT 34, as compared with the via hole c in the foregoing embodiment, the via hole d in such a structure only has to penetrate through a resin layer but does not need to penetrate through a gate insulating layer and an etching blocking layer. In this way, manufacture of the via hole becomes relatively simple, thereby reducing production difficulty of the display device further.

The foregoing are merely exemplary embodiments of the invention, but are not used to limit the protection scope of the invention. The protection scope of the invention is determined by attached claims.

What is claimed is:

1. An array substrate, comprising: a plurality of sub-pixel units defined by gate lines and data lines that cross with each other on a substrate, each of the sub-pixel units comprising a first thin film transistor (TFT), a second TFT and a pixel electrode, a gate electrode of the first TFT being connected to the gate line, a source electrode of the first TFT being connected to the data line, and a drain electrode of the second TFT being connected to the pixel electrode, wherein, the source electrode and a drain electrode of the first TFT are formed on a same layer as a gate electrode of the second TFT, and the drain electrode of the first TFT is directly connected to the gate electrode of the second TFT, wherein one of the first TFT and the second TFT is a TFT with a top-gate structure, and the other of the first TFT and the second TFT is a TFT with a bottom-gate structure, and wherein the TFT with the top-gate structure comprises: a source electrode and a drain electrode that are formed on a surface of the substrate and separated from each other, an active layer formed between the source electrode and the drain electrode, a first insulating layer located directly above the source electrode and the drain electrode, a second insulating layer that covers the first insulating layer and the active layer, and a gate electrode located over the second insulating layer; and the TFT with the bottom-gate structure comprises: a gate electrode formed on the surface of the substrate, a first insulating layer formed over the gate electrode, an active layer formed over the first insulating layer, a second insulating layer which is formed over the active layer and by which a part of the active layer is exposed, and a source electrode and a drain electrode that are formed over the second insulating layer and contact with the exposed active layer.

2. The array substrate according to claim 1, wherein, the array substrate further comprises a Vdd line for input of a positive power;

a source electrode of the second TFT in each of the sub-pixel units in a same row is connected to the Vdd line.

3. The array substrate according to claim 1, wherein, the pixel electrode fully covers the region of the sub-pixel unit.

4. The array substrate according to claim 1, wherein, the first TFT has the bottom-gate structure, and the second TFT has the top-gate structure.

5. The array substrate according to claim 1, wherein, the first TFT has the top-gate structure, and the second TFT has the bottom-gate structure.

6. The array substrate according to claim 1, wherein, the pixel electrode is connected to the drain electrode of the second TFT through a via hole with a light shielding material filled therein; and a surface of the light shielding material is flush with a surface of the pixel electrode.

7. The array substrate according to claim 1, wherein, in the TFT with the top-gate structure, the upper widths of the source electrode and the drain electrode are smaller than their lower widths so that side faces of the source electrode and the drain electrode are inclined planes, and the active layer contacts with the source electrode and the drain electrode through the inclined planes.

8. The array substrate according to claim 1, wherein, the drain electrode of the first TFT is integrally formed with the gate electrode of the second TFT.

9. The array substrate according to claim 2, wherein, the source electrode and the drain electrode of the first TFT and the data line are formed on the same layer, and the gate electrode of the first TFT and the source electrode and the drain electrode of the second TFT are formed on the same layer.

10. An organic light emitting diode (OLED) display device, comprising: an array substrate, a pixel electrode, a counter electrode formed on the array substrate and an organic light emitting layer located between the pixel electrode and the counter electrode of the array substrate, wherein, the array substrate is the array substrate according to claim 1.

* * * * *